(12) United States Patent
Wang et al.

(10) Patent No.: US 9,653,578 B2
(45) Date of Patent: May 16, 2017

(54) THIN FILM TRANSISTOR, ITS MANUFACTURING METHOD AND DISPLAY DEVICE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Wu Wang, Beijing (CN); Haijun Qiu, Beijing (CN); Fei Shang, Beijing (CN); Guolei Wang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 14/744,838

(22) Filed: Jun. 19, 2015

(65) Prior Publication Data

US 2016/0284819 A1    Sep. 29, 2016

(30) Foreign Application Priority Data

Mar. 26, 2015  (CN) .......................... 2015 1 0136966

(51) Int. Cl.
  *H01L 29/78* (2006.01)
  *H01L 29/66* (2006.01)
  *H01L 27/12* (2006.01)
  *H01L 29/786* (2006.01)

(52) U.S. Cl.
  CPC .... *H01L 29/66757* (2013.01); *H01L 27/1225* (2013.01); *H01L 29/7869* (2013.01); *H01L 29/78606* (2013.01)

(58) Field of Classification Search
  CPC .................................................. H01L 29/7869
  See application file for complete search history.

(56) References Cited

U.S. PATENT DOCUMENTS

2008/0105876 A1  5/2008  Han
2012/0132914 A1  5/2012  Chen et al.
(Continued)

FOREIGN PATENT DOCUMENTS

| CN | 101814455 A | 8/2010 |
| CN | 101840936 A | 9/2010 |
| CN | 101840937 A | 9/2010 |

OTHER PUBLICATIONS

First Office Action regarding Chinese Application No. 201510136966.2, dated Mar. 2, 2017. Translation provided by Dragon Intellectual Property Law Firm.

*Primary Examiner* — Tran Tran
(74) *Attorney, Agent, or Firm* — Harness, Dickey & Pierce, P.L.C.

(57) ABSTRACT

The present disclosure relates to the field of display technology, and provides a TFT, its manufacturing method and a display device. A first region of an active layer of the TFT corresponding to a gap between a source electrode and a drain electrode includes a metallic oxide semiconductor layer and a silicon semiconductor layer arranged on the metallic oxide semiconductor layer. The source electrode and the drain electrode are directly lapped onto the active layer.

18 Claims, 3 Drawing Sheets

(56) References Cited

U.S. PATENT DOCUMENTS

2013/0187164 A1* 7/2013 Oshima ............. H01L 29/78693
              257/59
2014/0084291 A1* 3/2014 Ye ..................... H01L 29/78603
              257/59
2015/0357356 A1* 12/2015 Kim ................... H01L 27/1288
              257/43

* cited by examiner

THIN FILM TRANSISTOR, ITS MANUFACTURING METHOD AND DISPLAY DEVICE

CROSS-REFERENCE TO RELATED APPLICATION

The present application claims a priority of the Chinese patent application No. 201510136966.2 filed on Mar. 26, 2015, which is incorporated herein by reference in its entirety.

TECHNICAL FIELD

The present disclosure relates to the field of display technology, in particular to a thin film transistor (TFT), its manufacturing method and a display device.

BACKGROUND

Depending on materials of an active layer, TFT mainly includes an oxide semiconductor TFT (oxide TFT for short) and an a-Si (amorphous silicon) TFT. The oxide TFT is more suitable for manufacturing a high-end product with a high resolution (high definition) and a high refresh rate (a smooth dynamic image) due to a large on/off current ratio (i.e., a situation where a current is larger and a charging time is shorter when the oxide TFT is turned on, and a leakage current is smaller and current leakage occurs seldom when the oxide TFT is turned off).

The oxide TFT with a back channel etch (BCE) structure has been widely used due to such advantages as a simple structure, a simple manufacturing process, a small size and a small parasitic capacitance. As shown in FIG. 1, a source electrode 1 and a drain electrode 2 are directly lapped onto an oxide semiconductor layer 3. To be specific, the oxide semiconductor layer 3 is formed at first, then a source/drain metal film is formed on the oxide semiconductor layer 3, and then the source/drain metal film is etched by a photolithographic process so as to form the source electrode 1 and the drain electrode 2. For the photolithographic process, it is required to etch off the source/drain metal film between the source electrode 1 and the drain electrode 2, so obviously the oxide semiconductor layer 3 therebetween will be corroded due to an etchant, and thereby a semiconductor characteristic of the TFT will be adversely affected.

In order to overcome the above drawbacks, in the related art, an etch stop layer 102 is arranged on the oxide semiconductor layer 3, and the source electrode 1 and the drain electrode 2 are in electrical contact with the oxide semiconductor layer 3 through a via-hole in the etch stop layer 102. However, an additional photolithographic process is desired for the etch stop layer 102, so the production cost will be increased. In addition, an aperture ratio will be adversely affected due to the via-hole in the etch stop layer 102.

SUMMARY

An object of the present disclosure is to provide a thin film transistor (TFT) and its manufacturing method, so as to simplify a process for manufacturing an oxide TFT with a BCE structure, and to reduce the production cost.

Another object of the present disclosure is to provide a display device including the above-mentioned TFT, so as to reduce the production cost and ensure the display quality.

In one aspect, the present disclosure provides in embodiments a thin film transistor (TFT), including an active layer, and a source electrode and a drain electrode lapped onto the active layer. The active layer includes a source region in contact with the source electrode, a drain region in contact with the drain electrode, and a first region corresponding to a gap between the source electrode and the drain electrode. The first region of the active layer includes a metallic oxide semiconductor layer and a silicon semiconductor layer arranged on the metallic oxide semiconductor layer.

In another aspect, the present disclosure provides in embodiments a method for manufacturing the above-mentioned thin film transistor (TFT), including a step of forming an active layer and a step of forming a source electrode and a drain electrode. The source electrode and the drain electrode are lapped onto the active layer. The active layer includes a source region in contact with the source electrode, a drain region in contact with the drain electrode, and a first region corresponding to a gap between the source electrode and the drain electrode. The step of forming the first region of the active layer includes:

forming a metallic oxide semiconductor layer and a silicon semiconductor layer sequentially; and patterning the metallic oxide semiconductor layer and the silicon semiconductor layer to form the first region of the active layer, the first region of the active layer including the metallic oxide semiconductor layer and the silicon semiconductor layer.

In yet another aspect, the present disclosure provides in embodiments a display device including the above-mentioned thin film transistor (TFT).

According to the embodiments of the present disclosure, the first region of the active layer corresponding to the gap between the source electrode and the drain electrode includes the metallic oxide semiconductor layer and the silicon semiconductor layer arranged on the metallic oxide semiconductor layer, and the source electrode and the drain electrode are directly lapped onto the active layer. When a source/drain metal layer corresponding to the first region is etched so as to form the source electrode and the drain electrode, it is able to prevent the metallic oxide semiconductor layer of the first region from being etched using the silicon semiconductor layer. In addition, the silicon semiconductor layer and the metallic oxide semiconductor layer of the active layer are formed simultaneously by a single patterning process, so it is unnecessary to add any manufacturing process, and thereby it is able to reduce the production cost. Further, the source electrode and the drain electrode are directly lapped onto the active layer, so it is unnecessary to provide any via-hole, and thereby it is able to improve an aperture ratio of the display device.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

Figure 1:
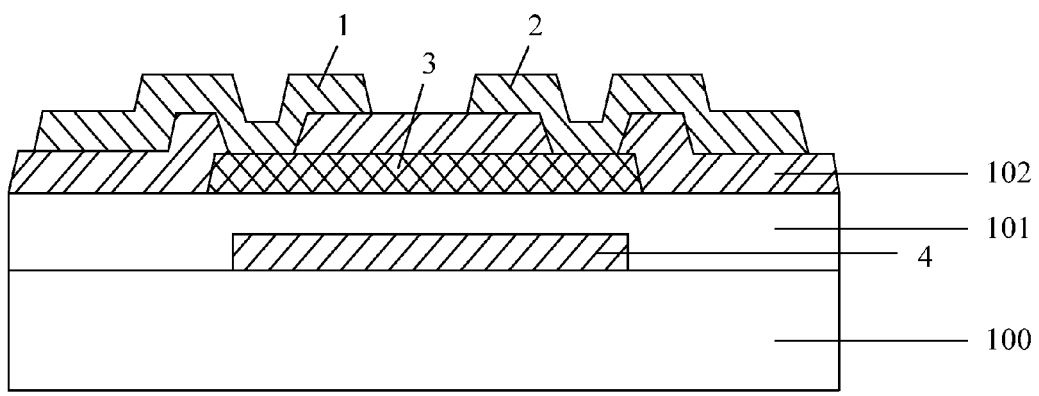
FIG. 1 is a schematic view showing an oxide TFT with a BCE structure in the related art.

For a process for manufacturing an oxide TFT with a BCE structure in the related art, an etch stop layer is arranged on an active layer, and a source electrode and a drain electrode are in electrical contact with the active layer through a via-hole in the etch stop layer, so as to prevent the active layer from being adversely affected by an etching process for manufacturing the source electrode and the drain electrode. As a result, an additional manufacturing process is required, the production cost thereof is increased, and an aperture ratio of a display device is certainly adversely affected due to the via-hole.

In order to overcome the above-mentioned drawbacks, the present disclosure provides in embodiments an oxide TFT with a BCE structure and its manufacturing method. According to embodiments of the present disclosure, a first region of an active layer corresponding to a gap between a source electrode and a drain electrode includes a metallic oxide semiconductor layer and a silicon semiconductor layer arranged on the metallic oxide semiconductor layer, and the source electrode and the drain electrode are directly lapped onto the active layer. When a source/drain metal layer corresponding to the first region is etched so as to form the source electrode and the drain electrode, it is able to prevent the metallic oxide semiconductor layer of the first region from being etched using the silicon semiconductor layer. In addition, the silicon semiconductor layer and the metallic oxide semiconductor layer of the active layer are formed simultaneously by a single patterning process, so it is unnecessary to add any manufacturing process, and thereby it is able to reduce the production cost. Further, the source electrode and the drain electrode are directly lapped onto the active layer, so it is unnecessary to provide any via-hole, and thereby it is able to improve an aperture ratio of the display device.

When the TFT is turned on, a conductive channel is formed at the first region of the active layer corresponding to the gap between the source electrode and the drain electrode.

Some processes involved in embodiments of the present disclosure will be illustrated briefly prior to the description of the present disclosure, so as to facilitate the understanding thereof.

During the manufacture of a semiconductor, a selected image, pattern or object is required to shield a film to be processed, so as to control a region where the etching is made. The above object having a specific pattern is referred to as a mask.

Along with the rapid development of IC manufacturing process, 45 nm and 32 nm technology nodes have become hotspots in recent years, so a photolithographic process, as the most critical process in the IC manufacturing process, has become a focus of attention. The accuracy of the mask, as a very important factor in the photolithographic process, has achieved very great improvement. An existing masking process can realize the nanometer-level accuracy, so as to meet the requirements of a minimum line width of 45 nm or 32 nm.

Etching refers to a procedure of selectively removing undesired portion from a film by a chemical or physical method. As its basic purpose, the etching is performed so as to form a mask pattern in an accurate manner. During the etching, a reserved photoresist layer (or a mask layer) is not eroded or etched obviously by an etchant source, and thus may serve as a mask so as to protect a to-be-reserved portion of the film. A region not protected by the photoresist is selectively etched off.

There are two basic etching processes for manufacturing the semiconductor, i.e., a dry etching process and a wet etching process.

For the dry etching process, plasma generated in a gaseous state is physically and chemically reacted with a film exposed to the plasma after the plasma passes through a photoresist window formed by a photolithographic process, so as to etch off a material at an exposed surface of the film. Through the dry etching process, it is able to acquire an extremely accurate characteristic pattern, i.e., it is able to control the accuracy in an optimal manner.

For the wet etching process, an aqueous chemical reagent (e.g., acid, base or solvent) is used to remove the material at the surface of the film in a chemical way. When the characteristic pattern is acquired by the wet etching process, the aqueous chemical reagent also needs to pass through a mask layer window formed by the photolithographic process, so as to etch off the material at the exposed surface.

As compared with the dry etching process, the wet etching process has a high selective ratio and a high etching efficiency. The wet etching process is mainly used to etch a film made of metal or metallic oxide, while the dry etching process is mainly used to etch a film made of photoresist, silicon oxide, silicon nitride or silicon oxynitride.

The present disclosure will be described hereinafter in conjunction with drawings and embodiments. The following embodiments are for illustrative purposes only, but shall not be used to limit the scope of the present disclosure.

The TFTs mentioned in embodiments of the present disclosure refer to oxide TFTs each with a BCE structure.

As shown in FIGS. 2 to 6, the present disclosure provides in embodiments a TFT, including an active layer, and a source electrode 1 and a drain electrode 2 lapped onto the active layer. The active layer includes a source region in contact with the source electrode 1, a drain region in contact with the drain electrode 2, and a first region corresponding to a gap between the source electrode 1 and the second electrode 2. When the TFT is turned on, a conductive channel is formed at the first region of the active layer.

Figure 2:
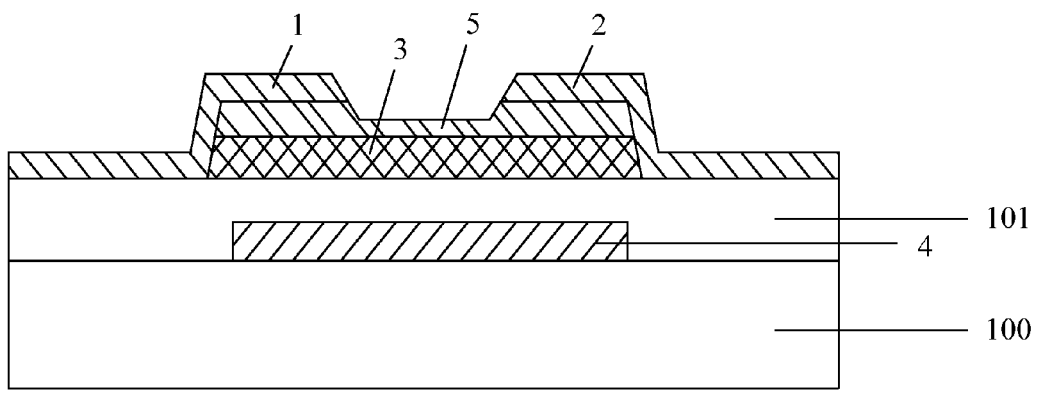
FIG. 2 is a schematic view showing an oxide TFT with a BCE structure according to an embodiment of the present disclosure.
Figure 3:
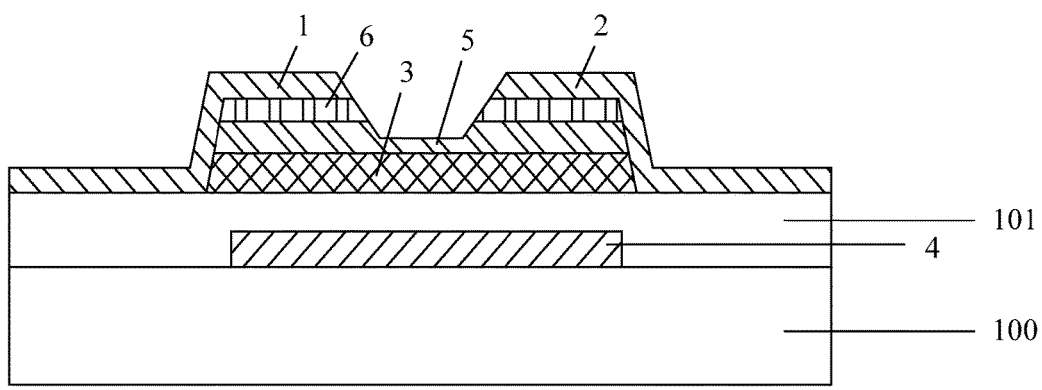
FIG. 3 is a schematic view showing an oxide TFT with a BCE structure according to another embodiment of the present disclosure.
Figure 4:
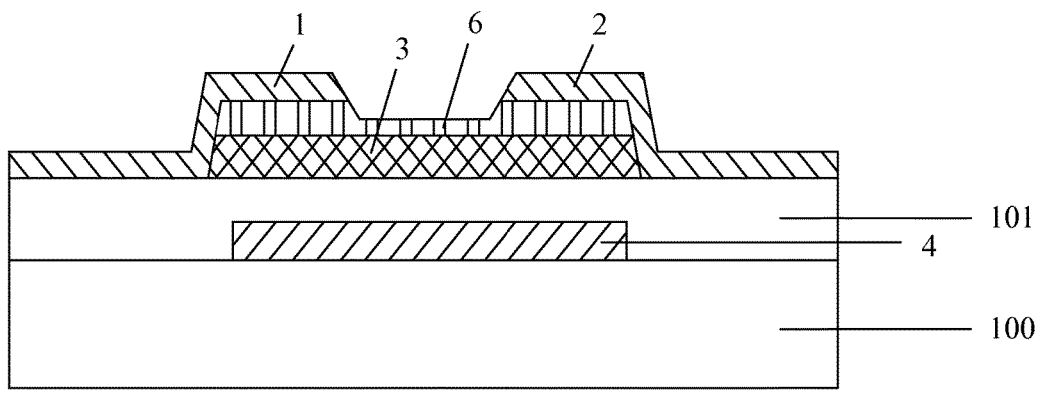
FIG. 4 is a schematic view showing an oxide TFT with a BCE structure according to yet another embodiment of the present disclosure.
Figure 5:
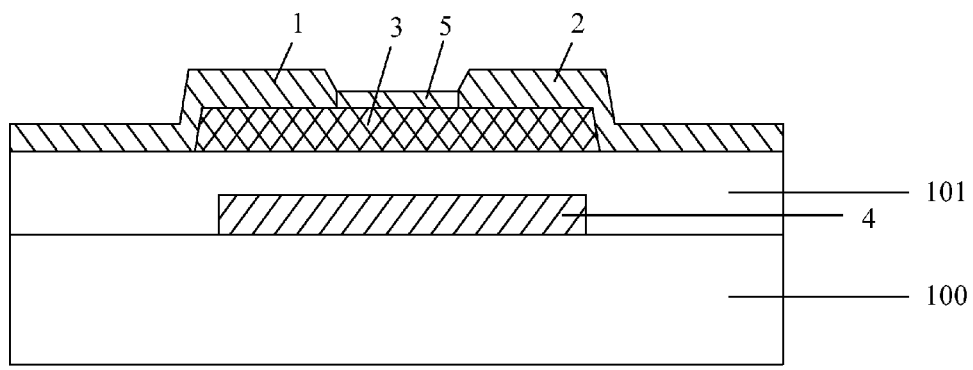
FIG. 5 is a schematic view showing an oxide TFT with a BCE structure according to still yet another embodiment of the present disclosure.
Figure 6:
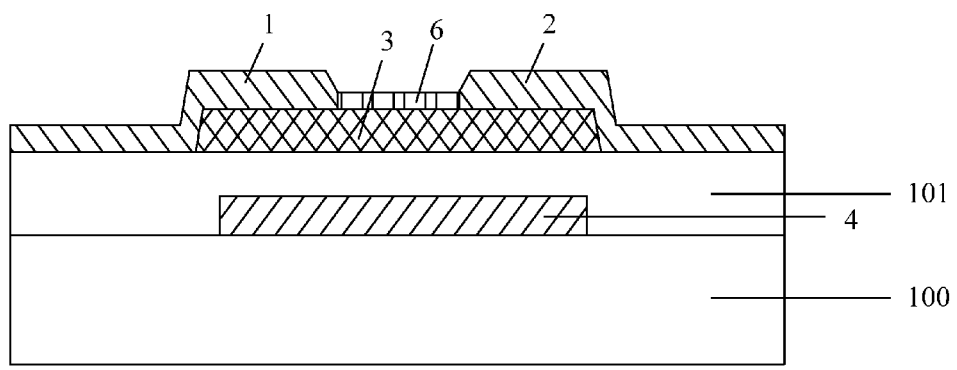
FIG. 6 is a schematic view showing an oxide TFT with a BCE structure according to still yet another embodiment of the present disclosure.

The first region of the active layer includes a metallic oxide semiconductor layer 3 and a silicon semiconductor layer (e.g., as shown in FIGS. 2, 3 and 5, an a-Si semiconductor layer 5, or as shown in FIGS. 3, 4 and 6, a heavily-doped a-Si semiconductor layer 6) arranged on the metallic oxide semiconductor layer 3.

The lapping of the source electrode 1 and the drain electrode 2 onto the active layer refers to that the source electrode 1 and the drain electrode 2 each partially, or completely, overlap the active layer, and a portion of each of the source electrode 1 and the drain electrode 2 overlapping the active layer is in direct contact with the active layer.

Correspondingly, the present disclosure provides in embodiments a method for manufacturing the TFT, including steps of:

forming the active layer; and forming the source electrode and the drain electrode, the source electrode and the drain electrode being lapped onto the active layer, the active layer including the source region in contact with the source electrode, the drain region in contact with the drain electrode, and the first region corresponding to the gap between the source electrode and the drain electrode.

The step of forming the first region of the active layer includes:

forming the metallic oxide semiconductor layer and the silicon semiconductor layer sequentially; and patterning the metallic oxide semiconductor layer and the silicon semiconductor layer to form the first region of the active layer, the first region of the active layer including the metallic oxide semiconductor layer and the silicon semiconductor layer.

According to the method in embodiments of the present disclosure, the first region of the active layer corresponding to the gap between the source electrode and the drain electrode includes the metallic oxide semiconductor layer and the silicon semiconductor layer arranged on the metallic oxide semiconductor layer, and the source electrode and the drain electrode are directly lapped onto the active layer. When a source/drain metal layer corresponding to the first region is etched so as to form the source electrode and the drain electrode, it is able to prevent the metallic oxide semiconductor layer of the first region from being etched using the silicon semiconductor layer. In addition, the silicon semiconductor layer and the metallic oxide semiconductor layer of the active layer are formed simultaneously by a single patterning process, so it is unnecessary to add any manufacturing process, and thereby it is able to reduce the production cost. Further, the source electrode and the drain electrode are directly lapped onto the active layer, so it is unnecessary to provide any via-hole, and thereby it is able to improve an aperture ratio of the display device.

In embodiments of the present disclosure, the source drain and the drain region of the active layer may merely consist of the metallic oxide semiconductor layer 3, as shown in FIGS. 5 and 6, or may consist of the metallic oxide semiconductor layer 3 and the silicon semiconductor layer, as shown in FIGS. 2 to 4.

In an alternative embodiment, the silicon semiconductor layer of the first region of the active layer is made of a-Si, i.e., the silicon semiconductor layer is an a-Si layer 5, as shown in FIGS. 2, 3 and 5.

When the silicon semiconductor layer of the first region of the active layer is the a-Si semiconductor layer 5, the source region and the drain region of the active layer may consist of the metallic oxide semiconductor layer 3 and the a-Si layer 5 arranged on the metallic oxide semiconductor layer 3, i.e., the entire active layer consists of the metallic oxide semiconductor layer 3 and the a-Si layer 5 arranged on the metallic oxide semiconductor layer 3, as shown in FIG. 2.

The step of forming the source electrode 1 and the drain electrode 2 includes:

forming a source/drain meal layer on the active layer, i.e., on the a-Si layer 5;

applying a photoresist onto the source/drain metal layer, exposing and developing the photoresist, so as to form a photoresist fully-reserved region corresponding to a region where the source electrode 1 and the drain electrode 2 are located, a photoresist half-reserved region corresponding to the first region of the active layer (i.e., the gap between the source electrode 1 and the drain electrode 2), and a photoresist unreserved region corresponding to other region;

etching off the source/drain metal layer at the photoresist unreserved region;

ashing the photoresist at the photoresist half-reserved region, and etching off the source/drain metal layer and the a-Si layer 5 with a certain thickness at the first region; and removing the remaining photoresist, so as to form the source electrode 1 and the drain electrode 2.

In the above step, the a-Si layer 5 with a certain thickness is etched off so as to ensure that the source/drain metal layer at the first region is fully etched off. To be specific, the source/drain metal layer may be etched off by a wet etching process, and the a-Si layer 5 may be etched by a dry etching process.

The source/drain metal layer may be made of Cu, Al, Ag, Mo, Cr, Nd, Ni, Mn, Ti, Ta, or W, or an alloy thereof, and it may be of a single-layered structure, or a multi-layered structure such as Cu/Mo, Ti/Cu/Ti or Mo/Al/Mo.

In the actual application, an ohmic contact layer may be arranged between the source electrode 1 or the drain electrode 2 and the a-Si layer 5, so as to improve a contact resistance between the source electrode 1 or the drain electrode 2 and the active layer. The ohmic contact layer is usually a heavily-doped a-Si layer 6, as shown in FIG. 3. In other words, the first region of the active layer consists of the metallic oxide semiconductor layer 3 and the a-Si layer 5 arranged on the metallic oxide semiconductor layer 3, and the source region and the drain region consist of the metallic oxide semiconductor layer 3 as well as the a-Si layer 5 and the heavily-doped a-Si layer 6 sequentially arranged on the metallic oxide semiconductor layer 3.

The step of forming the active layer includes forming the metallic oxide semiconductor layer, the a-Si layer and the heavily-doped a-Si layer sequentially, and patterning the metallic oxide semiconductor layer, the a-Si layer and the heavily-doped a-Si layer so as to form a pattern of the active layer, the entire active layer including the metallic oxide semiconductor layer, the a-Si layer and the heavily-doped a-Si layer.

Further, the step of forming the source electrode 1 and the drain electrode 2 includes:

forming the source/drain metal layer on the active layer;

applying a photoresist onto the source/drain metal layer, and exposing and developing the photoresist, so as to form a photoresist fully-reserved region corresponding to a region where the source electrode and the drain electrode are located, a photoresist half-reserved region corresponding to the first region of the active layer, and a photoresist unreserved region corresponding to other regions;

etching off the source/drain metal layer at the photoresist unreserved region;

ashing the photoresist at the photoresist half-reserved region, and etching off the source/drain metal layer and the heavily-doped a-Si layer at the first region; and removing the remaining photoresist, so as to form the source electrode 1 and the drain electrode 2.

In the above step, the source/drain metal layer may be etched off by a wet etching process, and the heavily-doped a-Si layer may be etched off by a dry etching process.

In an alternative embodiment, the source region and the drain region may merely consist of the metallic oxide semiconductor layer 3, as shown in FIG. 5.

The step of forming the active layer includes:

forming the metallic oxide semiconductor layer;

forming the silicon semiconductor layer on the metallic oxide semiconductor layer, the silicon semiconductor layer consisting of the a-Si layer, or the a-Si layer and the heavily-doped a-Si layer arranged on the a-Si layer;

applying a photoresist onto the silicon semiconductor layer, and exposing and developing the photoresist, so as to form a photoresist fully-reserved region corresponding to the first region of the active layer, a photoresist half-reserved region corresponding to the source region and the drain region of the active layer, and a photoresist unreserved region corresponding to other regions;

etching off the silicon semiconductor layer and the metallic oxide semiconductor layer at the photoresist unreserved region;

ashing the photoresist at the photoresist half-reserved region, and etching off the silicon semiconductor layer at the source region and the drain region; and removing the remaining photoresist, so as to form the active layer of the TFT.

In an alternative embodiment, the silicon semiconductor layer of the first region of the active layer may merely consist of the heavily-doped a-Si layer, i.e., the silicon semiconductor layer is just the heavily-doped a-Si layer 6, as shown in FIGS. 4 and 6.

When the silicon semiconductor layer of the first region of the active layer consists of the heavily-doped a-Si layer 6, the source region and the drain region of the active layer may consist of the metallic oxide semiconductor layer 3 and the heavily-doped a-Si layer 6, i.e., the entire active layer consists of the metallic oxide semiconductor layer 3 and the heavily-doped a-Si layer 6, as shown in FIG. 4.

The step of forming the source electrode and the drain electrode includes:

forming the source/drain metal layer on the active layer, i.e., on the heavily-doped a-Si layer 6;

applying a photoresist onto the source/drain metal layer, and exposing and developing the photoresist, so as to form a photoresist fully-reserved region corresponding to a region where the source electrode 1 and the drain electrode 2 are located, a photoresist half-reserved region corresponding to the first region of the active layer, and a photoresist unreserved region corresponding to other regions;

etching off the source/drain metal layer at the photoresist unreserved region;

ashing the photoresist at the photoresist half-reserved region, and etching off the source/drain metal layer and the heavily-doped a-Si layer with a certain thickness at the first region; and removing the remaining photoresist, so as to form the source electrode 1 and the drain electrode 2.

In an embodiment, the source region and the drain region of the active layer may merely consist of the metallic oxide semiconductor layer 3, as shown in FIG. 6.

At this time, the step of forming the active layer includes;

forming the metallic oxide semiconductor layer and the heavily-doped a-Si layer sequentially;

applying a photoresist onto the heavily-doped a-Si layer, and exposing and developing the photoresist, so as to form a photoresist fully-reserved region corresponding to the first region of the active layer, a photoresist half-reserved region corresponding to the source region and the drain region of the active layer, and a photoresist unreserved region corresponding to other regions;

etching off the metallic oxide semiconductor layer and the heavily-doped a-Si layer at the photoresist unreserved region;

ashing the photoresist at the photoresist half-reserved region, and etching off the heavily-doped a-Si layer at the source region and the drain region; and removing the remaining photoresist, so as to form the active layer of the TFT.

It should be appreciated that, in the above embodiments, the a-Si layer may be replaced with a poly-Si layer, and the heavily-doped a-Si layer may be replaced with a heavily-doped poly-Si layer. When the silicon semiconductor layer is the heavily-doped poly-Si layer, the TFT is of a structure identical to the TFT whose silicon semiconductor layer is the a-Si layer, and their manufacturing methods are similar too and thus will not be repeated herein.

As shown in FIGS. 2 to 6, by taking a bottom-gate TFT as an example, the TFT includes:

a transparent base substrate 100, e.g., a glass substrate, a quartz substrate or an organic resin substrate;

a gate electrode 4 arranged on the base substrate 100, the gate electrode 4 being made of Cu, Al, Ag, Mo, Cr, Nd, Ni, Mn, Ti, Ta or W, or an alloy thereof, the gate electrode 4 being of a single-layered structure, or a multi-layered structure such as Cu/Mo, Ti/Cu/Ti or Mo/Al/Mo;

a gate insulating layer 101 covering the gate electrode 4, the gate insulating layer 101 being made of an oxide, a nitride or an oxynitride, the gate insulating layer being of a single-layered, double-layered or multi-layered structure, the gate insulating layer 101 being specifically made of SiNx, SiOx or Si(ON)x;

an active layer arranged on the gate insulating layer 101, the active layer including the source region in contact with the source electrode 1, the drain region in contact with the drain electrode 2, and the first region corresponding to the gap between the source electrode 1 and the drain electrode 2; a conductive channel being formed at the first region of the active layer when the TFT is turned on; the first region of the active layer consisting of the metallic oxide semiconductor layer 3 and the a-Si layer 5 arranged on the metallic oxide semiconductor layer 3, or the metallic oxide semiconductor layer 3 and the heavily-doped a-Si layer 6 on the metallic oxide semiconductor layer 3, or the metallic oxide semiconductor layer 3 as well as the a-Si layer 5 and the heavily-doped a-Si layer 6 on the metallic oxide semiconductor layer 3; the source region and the drain region of the active layer consisting of the metallic oxide semiconductor layer 3 and the a-Si layer arranged on the metallic oxide semiconductor layer 3, or the metallic oxide semiconductor layer 3 as well as the a-Si layer 5 and the heavily-doped a-Si layer 6 on the metallic oxide semiconductor layer 3, or merely the metallic oxide semiconductor layer 3; and the source electrode 1 lapped onto the source region of the active layer and the drain electrode 2 lapped onto the drain region of the active layer.

The TFT in embodiments of the present disclosure may also be a top-gate or coplanar TFT, but not limited to the bottom-gate TFT.

The present disclosure further provides in embodiments a display device including the above-mentioned TFT, so as to reduce the production cost and ensure the display device.

The display device may be any product or member having a display function, such as a liquid crystal panel, an electronic paper, an OLED panel, a mobile phone, a flat-panel PC, a TV, a display, a laptop PC, a digital photo frame and a navigator.

According to embodiments of the present disclosure, the first region of the active layer corresponding to the gap between the source electrode and the drain electrode includes the metallic oxide semiconductor layer and the silicon semiconductor layer arranged on the metallic oxide semiconductor layer, and the source electrode and the drain electrode are directly lapped onto the active layer. When a source/drain metal layer corresponding to the first region is etched so as to form the source electrode and the drain electrode, it is able to prevent the metallic oxide semiconductor layer of the first region from being etched using the silicon semiconductor layer. In addition, the silicon semiconductor layer and the metallic oxide semiconductor layer of the active layer are formed simultaneously by a single patterning process, so it is unnecessary to add any manufacturing process, and thereby it is able to reduce the production cost. Further, the source electrode and the drain electrode are directly lapped onto the active layer, so it is unnecessary to provide any via-hole, and thereby it is able to improve an aperture ratio of the display device.

The above are merely the preferred embodiments of the present disclosure. It should be appreciated that, a person skilled in the art may make further modifications and improvements without departing from the principle of the present disclosure, and these modifications and improvement shall also fall within the scope of the present disclosure.

What is claimed is:

1. A thin film transistor (TFT): comprising an active layer, and a source electrode and a drain electrode lapped onto the active layer, the active layer comprising a source region in contact with the source electrode, a drain region in contact with the drain electrode, and a first region corresponding to a gap between the source electrode and the drain electrode, wherein the first region of the active layer comprises a metallic oxide semiconductor layer and a silicon semiconductor layer arranged on the metallic oxide semiconductor layer, the silicon semiconductor layer consists of an amorphous Silicon (a-Si) layer, and the metallic oxide semiconductor layer is arranged on a gate insulating layer and is in direct contact with the gate insulating layer.

2. The TFT according to claim 1, wherein the source region and the drain region of the active layer consist of the metallic oxide semiconductor layer and the a-Si layer arranged on the metallic oxide semiconductor layer.

3. The TFT according to claim 1, wherein the source region and the drain region of the active layer consist of the metallic oxide semiconductor layer as well as the a-Si layer and a heavily-doped a-Si layer sequentially arranged on the metallic oxide semiconductor layer.

4. The TFT according to claim 1, wherein the silicon semiconductor layer consists of a heavily-doped a-Si layer, and the source region and the drain region of the active layer consist of the metallic oxide semiconductor layer and the heavily-doped a-Si layer arranged on the metallic oxide semiconductor layer.

5. The TFT according to claim 1, wherein the source region and the drain region of the active layer consist of the metallic oxide semiconductor layer.

6. A method for manufacturing a thin film transistor (TFT), wherein the TFT comprises: an active layer, and a source electrode and a drain electrode lapped onto the active layer, the active layer comprising a source region in contact with the source electrode, a drain region in contact with the drain electrode, and a first region corresponding to a gap between the source electrode and the drain electrode, wherein the first region of the active layer comprises a metallic oxide semiconductor layer and a silicon semiconductor layer arranged on the metallic oxide semiconductor layer, the silicon semiconductor layer consists of an amorphous Silicon (a-Si) layer, and the metallic oxide semiconductor layer is arranged on a gate insulating layer and is in direct contact with the gate insulating layer;

wherein the method comprises: a step of forming the active layer and a step of forming the source electrode and the drain electrode, wherein the step of forming the first region of the active layer comprises:

forming the metallic oxide semiconductor layer and the a-Si layer sequentially; and patterning the metallic oxide semiconductor layer and the a-Si layer, so as to form the first region of the active layer, the first region of the active layer comprising the metallic oxide semiconductor layer and the a-Si layer.

7. The method according to claim 6, wherein the entire active layer consists of the metallic oxide semiconductor layer and the a-Si layer laminated one another.

8. The method according to claim 7, wherein the step of forming the source electrode and the drain electrode comprises:

forming a source/drain metal layer on the active layer;

applying a photoresist onto the source/drain metal layer, and exposing and developing the photoresist, so as to form a photoresist fully-reserved region corresponding to a region where the source electrode and the drain electrode are located, a photoresist half-reserved region corresponding to the first region of the active layer, and a photoresist unreserved region corresponding to other regions;

etching off the source/drain metal layer at the photoresist unreserved region;

ashing the photoresist at the photoresist half-reserved region, and etching off the source/drain metal layer and the a-Si layer with a certain thickness at the first region; and removing the remaining photoresist, so as to form the source electrode and the drain electrode.

9. The method according to claim 6, wherein the source region and the drain region of the active layer consist of the metallic oxide semiconductor layer as well as the a-Si layer and a heavily-doped a-Si layer sequentially arranged on the metallic oxide semiconductor layer, and the a-Si layer and the heavily-doped a-Si layer are laminated one another.

10. The method according to claim 9, wherein the step of forming the active layer comprises:

forming the metallic oxide semiconductor layer, the a-Si layer and the heavily-doped a-Si layer sequentially, and patterning the metallic oxide semiconductor layer, the a-Si layer and the heavily-doped a-Si layer so as to form a pattern of the active layer, the entire active layer comprising the metallic oxide semiconductor layer, the a-Si layer and the heavily-doped a-Si layer, and the step of forming the source electrode and the drain electrode comprises:

forming a source/drain metal layer on the active layer;

applying a photoresist onto the source/drain metal layer, and exposing and developing the photoresist, so as to form a photoresist fully-reserved region corresponding to a region where the source electrode and the drain electrode are located, a photoresist half-reserved region corresponding to the first region of the active layer, and a photoresist unreserved region corresponding to other regions;

etching off the source/drain metal layer at the photoresist unreserved region;

ashing the photoresist at the photoresist half-reserved region, and etching off the source/drain metal layer and the heavily-doped a-Si layer at the first region; and removing the remaining photoresist, so as to form the source electrode and the drain electrode.

11. The method according to claim 6, wherein the silicon semiconductor layer consists of a heavily-doped a-Si layer, and the source region and the drain region of the active layer consist of the metallic oxide semiconductor layer and the heavily-doped a-Si layer arranged on the metallic oxide semiconductor layer.

12. The method according to claim 11, wherein the step of forming the source electrode and the drain electrode comprises:
   forming a source/drain metal layer on the active layer;
   applying a photoresist onto the source/drain metal layer, and exposing and developing the photoresist, so as to form a photoresist fully-reserved region corresponding to a region where the source electrode and the drain electrode are located, a photoresist half-reserved region corresponding to the first region of the active layer, and a photoresist unreserved region corresponding to other regions;
   etching off the source/drain metal layer at the photoresist unreserved region;
   ashing the photoresist at the photoresist half-reserved region, and etching off the source/drain metal layer and the heavily-doped a-Si layer with a certain thickness at the first region; and
   removing the remaining photoresist, so as to form the source electrode and the drain electrode.

13. The method according to claim 6, wherein the source region and the drain region of the active layer consist of the metallic oxide semiconductor layer.

14. The method according to claim 13, wherein the step of forming the active layer comprises:
   forming the metallic oxide semiconductor layer;
   forming the a-Si layer on the metallic oxide semiconductor layer;
   applying a photoresist onto the a-Si layer, and exposing and developing the photoresist, so as to form a photoresist fully-reserved region corresponding to the first region of the active layer, a photoresist half-reserved region corresponding to the source region and the drain region of the active layer, and a photoresist unreserved region corresponding to other regions;
   etching off the a-Si layer and the metallic oxide semiconductor layer at the photoresist unreserved region;
   ashing the photoresist at the photoresist half-reserved region, and etching off the a-Si layer at the source region and the drain region; and
   removing the remaining photoresist, so as to form the active layer of the TFT.

15. A display device comprising the thin film transistor (TFT) according to claim 1.

16. The TFT according to claim 1, wherein the source region and the drain region of the active layer comprise the metallic oxide semiconductor layer and the a-Si layer arranged on the metallic oxide semiconductor layer.

17. The TFT according to claim 16, wherein the source region and the drain region of the active layer further comprise a heavily-doped a-Si layer, and the a-Si layer and the heavily-doped a-Si layer are sequentially arranged on the metallic oxide semiconductor layer.

18. The TFT according to claim 1, wherein the source region and the drain region of the active layer comprise the metallic oxide semiconductor layer.

* * * * *